United States Patent [19]

Jolly et al.

[11] 4,297,435

[45] Oct. 27, 1981

[54] CONTRAST COLORANT FOR PHOTOPOLYMERIZABLE COMPOSITIONS

[75] Inventors: Jennings L. Jolly, Santa Clara; Leo Roos, San Jose, both of Calif.

[73] Assignee: Hercules Incorporated, Wilmington, Del.

[21] Appl. No.: 179,310

[22] Filed: Aug. 18, 1980

Related U.S. Application Data

[63] Continuation-in-part of Ser. No. 15,980, Feb. 26, 1979, abandoned.

[51] Int. Cl.³ ............................ G03C 1/52; G03C 1/68
[52] U.S. Cl. ................................. 430/270; 430/277; 430/281; 430/286; 430/344; 430/292; 430/925; 430/916
[58] Field of Search ............... 96/90 R, 115 P, 86; 430/281, 270, 344, 277, 286, 292, 916, 925

[56] References Cited

U.S. PATENT DOCUMENTS

| | | | |
|---|---|---|---|
| 3,113,024 | 12/1963 | Sprague et al. | 430/343 |
| 3,525,616 | 8/1970 | Hackmann et al. | 430/270 |
| 3,712,817 | 1/1973 | Hazy | 430/269 |
| 3,769,023 | 10/1973 | Lewis et al. | 430/282 |
| 4,065,315 | 12/1977 | Yamazaki et al. | 430/281 |

*Primary Examiner*—Won H. Louie, Jr.
*Attorney, Agent, or Firm*—Marion C. Staves

[57] ABSTRACT

Stable print-out dye systems are provided for photopolymerizable compositions, finding particular use as photoresists. The dye compositions comprise a triarylmethane leuco dye in combination with a high-boiling, relatively thermally-insensitive polyhalo alicyclic compound having at least five bromines. The print-out dye system is incorporated with an addition polymerizable composition, a light-sensitive initiator, and minor amounts of other additives.

11 Claims, No Drawings

CONTRAST COLORANT FOR PHOTOPOLYMERIZABLE COMPOSITIONS

This application is a continuation-in-part of our co-pending U.S. patent application Ser. No. 15,980, filed Feb. 26, 1979, now abandoned.

BACKGROUND OF THE INVENTION

1. Field of the Invention

In the manufacture of printed circuit boards by the subtractive process, the process involves adhering a photopolymerizable film to the surface of a copper-clad laminate while covering the photopolymerizable layer with a protective film or support. Upon exposure to light in accordance with a predetermined pattern, those portions of the photopolymerizable layer exposed to the light form a solvent resistant pattern, while the unexposed portions may be readily washed away. The exposed copper layer may then be etched or plated.

The dry, photopolymerizable photoresist films are typically light in color and transparent. When viewed in relation to the underlying copper surface, it is extremely difficult to be able to determine the presence or absence of the film, so as to assure that the circuit design has been accurately delineated on the copper plate. In order to aid in the inspection of the photoresist layer, a number of different dye systems have been taught for incorporation in the photopolymerizable layer.

There are many considerations, both as to operability and practicality, in the choice of the dye systems. The dye system should allow for a clearly observable layer when in contact with the copper plate. Furthermore, the dye system may not significantly interfere with the curing of the layer upon exposure to light. The dye may interfere by absorbing light, so as to prevent light penetration through the layer or acting as a free-radical polymerization inhibitor, so as to react with free-radicals to terminate chains. In addition, the dye system should not be unduly sensitive to heat, base or acid, so that it may remain stable for long periods of time during storage, as well as during processing. Otherwise, if the dye has been subject to extensive degradation prior to curing of the photoresist, the observed color will be faint and not readily discernible.

2. Description of the Prior Art

U.S. Pat. No. 3,113,024 is directed to photosystems based on leuco bases of triphenylmethane dyes and teaches the heat sensitivity of the dyes with certain active sulfonyl halides.

U.S. Pat. No. 3,525,616 is directed to reproduction materials comprising at least one leuco triarylmethane dye, at least one N-vinyl carbazole, and at least one halogen hydrocarbon which splits off halogen when exposed to light. In the prior art disclosed system the halogen hydrocarbon activates both the color formation and the photopolymerization of the N-vinyl carbazole. In addition, many of the prior art halogen hydrocarbons, e.g., hexachlorocyclohexane, are highly toxic, can be absorbed through the skin and are strong irritants to the eyes. Moreover, some of the halogen hydrocarbons react with copper foil to form interfering complexes.

U.S. Pat. No. 3,769,023 is directed to light-sensitive reproduction material comprising (1) a hydroxyalkyl cellulose; (2) an ethylenically unsaturated vinyl monomer, preferably an N-vinyl monomer; (3) at least one compound which produces free radicals on exposure to light; (4) color formers taken from the general class of intermediates which produce color on exposure to condensation agents, oxidizing agents, and/or acids; (5) organic sulfur compounds for the promotion of adhesion; and (6) agents for improving the shelf stability of the product. In this system the compound which produces free-radicals activates both the color formation and the photopolymerization. The preferred activators are the organic halogen compounds in which at least three halogen atoms are attached to a single carbon atom.

U.S. Pat. No. 4,065,315 is directed to phototropic dye systems. It has an extended discussion of dyes and discloses the combination of an organic halide capable of liberating halogen free radicals on exposure to actinic light in combination with the free base of triarylmethane dyestuffs. The free base of triarylmethane dyestuff may be shown as

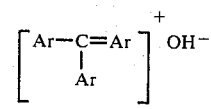

One problem which attends the use of such dyestuffs is their instability to storage, a problem noted by the inventors in column 19, lines 60–62. Another problem attending the use of the dye system disclosed in U.S. Pat. No. 4,065,315 is the high toxicity of some of the organic halides used therein.

SUMMARY OF THE INVENTION

Print-out dye systems are provided for use in photopolymerizable composition, particularly as photoresist layers on copper surfaces. The print-out dye system comprises in combination, the leuco form of a triarylmethane dyestuff with a thermally stable, light-sensitive, polyhalo alicyclic compound having at least five bromine substituents and being substantially free of geminal halogen substitution. The print-out dye system is incorporated into a photopolymerizable composition comprising a polymeric binder, at least one addition polymerizable monomer, at least one photoinitiator, normally a small amount of a dye contrasting with the colored form of the triarylmethane dyestuff, and minor amounts of other additives. Upon exposure to actinic light, the print-out dye system develops an intensely colored layer in the exposed areas readily distinguishable from the unexposed photopolymerizable composition and copper underlayer, which exposed layer is stable during development, plating and etching treatments.

DESCRIPTION OF THE SPECIFIC EMBODIMENTS

In accordance with the subject invention, a novel print-out system is provided which involves a combination of a triarylmethane leuco dyestuff and a polyhalogenated alicyclic compound, free of halogen geminal substitution, containing at least five bromines and which is non-sublimable and boils at greater than 200° C. at atmospheric pressure. The print-out dye system will normally be used incorporated in an addition polymerizable composition involving a polymeric binder, at least one addition polymerizable monomer, usually involving combinations of monomers, having one or a plurality of addition polymerizable ethylenic groups, a photoinitiator, a dye having a color contrasting with the colored form of the triarylmethane dye, solvents and minor amounts of other materials. The photopolymerizable composition should be relatively free of oxidants, for example, peroxides.

The subject composition as photoresist formulations is found to be stable for long periods of time, under normal storage conditions as well as upon storing in contact with copper surfaces. In addition, it is stable during development in both aqueous and non-aqueous developers, as well as in acid or alkaline plating environments. The leuco dye print-out system, which has virtually no effect on the separate photopolymerization reaction, reaches maximum density within 60 seconds after exposure.

In describing the subject invention, the print-out system will be considered first, following by the various elements of the photopolymerizable system.

The compounds of choice used in the print-out system must meet certain criteria, as follows:

(a) The triarylmethane leuco dyestuff and polyhalogenated alicyclic compounds must be carefully chosen so that they produce an intense color when exposed to actinic light. Not only must the color be intense, but it must also be of a hue which stands out against the unexposed coating and the copper background and does not fade over a reasonable period of time.

(b) The compounds must be reasonably non-toxic and not irritate the skin or give off fumes that irritate the eyes.

(c) The compounds must not appreciably interfere with the photopolymerization of the photopolymerizable system. In other words, the compounds must not act as chain transfer or chain propagating agents, causing brittleness of the cured photopolymerization system due to the formation of low molecular weight, mixed polymers. In addition, the compounds must not reduce the photospeed of the photopolymerizable system.

(d) The wavelength of light where the compounds are activated (by the generation of free radicals) must not significantly overlap the absorption maxima of the photopolymerization initiator in the photopolymerizable system or any cover sheet used in the process. Most preferably, the polyhalogenated alicyclic compound will exhibit a $D_{max}$ of above 300 nm.

(e) The compounds of choice must not form complexes with copper or act as adhesion promoters between the copper and the other systems.

(f) The compounds must not leach out into the plating bath or contaminate the plating bath or subsequent operations.

(g) The compounds must be reasonably storage and heat stable when combined and not effect color formation before they are exposed to actinic light.

(h) The compounds must not sublime, evaporate, or diffuse during the drying and winding cycles, or during storage.

It has now been discovered that the above criteria are met by the print-out system of this invention, which has in combination a leuco triarylmethane dye and a polyhalogenated alicyclic compound containing at least five bromines and which is free of geminal substitution.

The mole ratio of the triarylmethane dye to halogenated alicyclic compound used in the composition of this invention will vary with the nature of the halogenated alicyclic compound. The mole ratio of dye to halogenated alicyclic compound will generally be in the range of about 0.2-5, more usually 0.5-2. Usually there will be about 0.01 to 3, more usually about 0.1 to 2, and preferably about 0.5 to 2 parts by weight of halogenated alicyclic compound per part by weight of dye.

The leuco triarylmethane dyes will have the tertiary carbon atom bonded to hydrogen and the individual phenyl rings may be substituted or unsubstituted, usually having not more than about two substituents per ring, more usually having not more than about one substituent per ring, which will usually be ortho or para, more usually para. The substituents may be joined to provide polycondensed systems, such as xanthenes, acridine, and the like. The substituents may be amino (including mono- and dialkyl amino, wherein the alkyl groups are from 1 to 6, usually from 1 to 2 carbon atoms), oxy, hydroxy or alkoxy, particularly alkoxy, wherein the alkoxy group is of 1 to 6, usually of 1 to 2 carbon atoms, halo of atomic number 9 to 80, usually 9 to 35, alkyl of from 1 to 6, usually from 1 to 2 carbon atoms, non-oxo-carbonyl, nitro, sulfo, acyl, or the like. The substituents will be chosen based on convenience, lack of interference with the photopolymerizable system, the desired color, thermal and oxidative stability under the conditions of use, and other practical considerations. The particular choice of the substituents on the triarylmethane leuco dye may be varied widely within the subject invention.

For the most part, the leuco dyes of this invention will have the following formula:

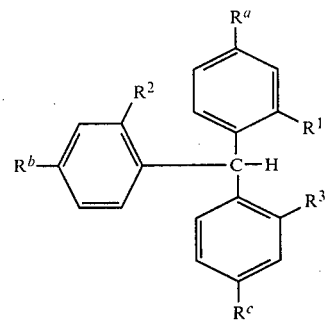

wherein:

$R^a$, $R^b$ and $R^c$ may be the same or different, and will generally be hydrogen, amino, including mono, and dialkyl amino, wherein the alkyl group are from 1 to 6, usually from 1 to 2 carbon atoms, oxy, including hydroxy or alkoxy, preferably alkoxy, wherein alkoxy is of from 1 to 6, usually from 1 to 2 carbon atoms, non-oxo-carbonyl of from 1 to 6, usually 1 to 4 carbon atoms, halo of atomic number 9 to 80, usually 9 to 53, and preferably 17 to 53, alkyl of from 1 to 6, usually of from 1 to 3, and more usually from 1 to 2 carbon atoms, cyano, nitro, or the like;

$R^1$, $R^2$ and $R^3$ may be the same or different and may be the same or different from $R^a$, $R^b$ and $R^c$, $R^1$, $R^2$ and $R^3$ more usually being hydrogen or $R^2$ may form a ring with an adjacent aryl group through a carbon atom or heteroatom, e.g., N, O and S.

Preferred groups for $R^a$, $R^b$ and $R^c$ are amino, dialkyl amino, wherein alkyl is of from 1 to 3, usually 1 to 2 carbon atoms, alkoxy of from 1 to 3, usually 1 to 2 carbon atoms, or chloro, more preferably there being at least 1, usually 1 to 2, and more usually 1 to 3, amino groups, including alkyl and dialkyl amino.

Illustrative leuco dyes include crystal violet, malachite green, basic blue, pararosaniline, rosaniline, patent blue A or V, or the like.

The halogenated alicyclic compound which is the other member of the print-out dye composition is a cycloalkane, boiling at atmospheric pressure above about 200° C., having at least five bromine atoms, wherein heterosubstituents are other than geminal (i.e., no more than one substituent per carbon atom), is stable under processing conditions, but is able to undergo bond cleavage during irradiation with light, and is otherwise stable prior to the light irradiation, and does not adversely interfere with the photopolymerization.

The bromocycloalkanes will have the following formula:

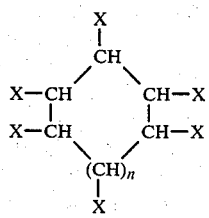

wherein at least five of the X's are bromine and the remaining X's are hydrogen, bromine, or chlorine; and n is 0 to 3, most preferably 1. A particularly preferred polyhalogenated alicyclic compound is 1,2,3,4,5-pentabromo-6-chlorocyclohexane.

Turning now to a consideration of the photopolymerizable system which, with the print-out system described above, can be used as a photoresist composition. The composition of this invention will normally have from about 40 to 80 weight percent of a polymeric binder, from about 15 to 30 weight percent of one or more monomers, from about 0.001 to 10 percent by weight of polymerization free-radical initiator or photoinitiator, from about 0.01 to 2 weight percent of the leuco triarylmethane dye, from about 0.1 to 4 weight percent of the polyhalogenated alicyclic compound, from about 0.01 to 0.1 weight percent of a colored dye contrasting with the leuco dye, and from about 0.001 to 5 weight percent of various additives, such as plasticizers, antioxidants, fillers, thixotropic, leveling agents, and adhesion promoters. If desired, pigments can also be included.

From the above, it can be seen that the photopolymerizable system of the photopolymerizable composition of this invention consists essentially of
 (a) at least one polymerizable monomer,
 (b) a polymeric binder, and
 (c) a photoinitiator.

The polymerizable monomer may have from 1 to 4, usually 1 to 3, preferably 2 to 3, addition polymerizable olefinic groups. The following addition polymerizable olefins are illustrative of the polymerizable monomers which find use in this invention.

Suitable monomers which can be used alone or in combination include the alkylene and polyalkylene glycol diacrylates prepared from alkylene glycols having two to fifteen carbon atoms or polyalkylene ether glycols of one to ten ether linkages. Outstanding materials are ethylenically unsaturated groups, especially vinylidene groups, conjugated with ester or amide structures. The following specific compounds are further illustrative of this class: unsaturated esters of polyols, particularly such esters as the α-methylene carboxylic acids, e.g., ethylene diacrylate; diethylene glycol diacrylate; glycerol diacrylate; glycerol triacrylate; ethylene dimethacrylate; 1,3-propanediol dimethacrylate; 1,2,4-butanetriol trimethacrylate; 1,4-benzenediol dimethacrylate; 1,4-cyclohexanediol diacrylate; pentaerythritol tri- and tetramethacrylate; pentaerythritol tetraacrylate; 1,3-propanediol diacrylate; 1,5-pentanediol dimethacrylate; the bis-acrylates and methacrylates of polyethylene glycols of molecular weight 100–1500 and the like; unsaturated amides, particularly those of the α-methylene carboxylic acids, and especially those of alpha, omega-diamines and oxygen-interrupted omega-diamines, such as methylene bis-acrylamide; methylene bis-methacrylamide; 1,6-hexamethylene bis-acrylamide; diethylenetriamine tris-methacrylamide; bis(methacrylamidopropoxy) ethane; β-methacrylamidethyl methacrylate; and N-[(β-hydroxyethyloxy)ethyl]acrylamide.

In a preferred embodiment the ethylenically unsaturated addition polymerizable monomer is an acrylyl or methacrylyl compound or derivative thereof, including low molecular weight dimers, trimers, etc., i.e., oligomers. Particularly useful results are obtained when a dry film photoresist composition contains a preferred curable or crosslinkable polymer or oligomer and an acrylyl ester as the ethylenically unsaturated addition polymerizable compound. The acrylyl esters that are particularly useful are the mono- and polyacrylyl compounds of general formula:

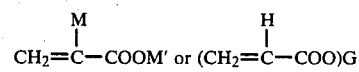

where the acrylyl compound has the formula

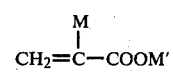

M is H or CH$_3$

M' is cycloalkyl of 5 to 12 carbon atoms (such as cyclopentyl, dicyclopentyl, methylcyclopentyl, dimethylcyclopentyl, etc.)

cycloalkenyl of 5 to 12 carbon atoms (such as cyclopentenyl, methylcyclopentenyl, dicyclopentenyl, bicyclo [2.2.1] hept-2-en-yl, etc.)

—C$_p$H$_{2q}$M'' or
 (C$_q$H$_{2q}$O)$_s$C$_q$H$_{2q+s}$
where
 p is an integer from 1 to 10
 q is an integer from 2 to 4
 s is an integer from 0 to 4
 M'' is hydrogen, hydroxyl, phenoxy, alkoxy of 1 to 8 carbon atoms;
and where the acrylyl compound has the formula

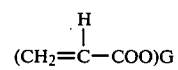

G is a polyvalent alkylene group of formula —C$_2$H$_{2x-y}$—
in which
 x is an integer from 2 to 8
 y is an integer from 0 to 2 (for example, divalent alkylene when y=0 such as —C$_2$H$_4$—, C$_3$H$_6$—iso—C$_3$-

$H_6$—, —$C_5H_{10}$—, neo—$C_6H_{12}$— etc.; trivalent alkylene when y=1 such as

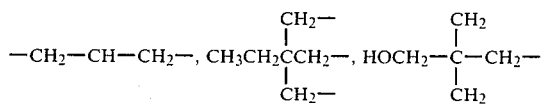

or tetravalent alkylene when y is 2, such as

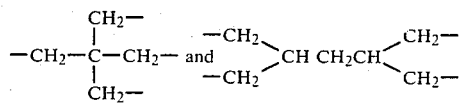

etc.)
or G is a divalent ether or ester group of formula
—$(C_qH_{2q}O)_tC_qH_{2q}$— or
—$(C_qH_{2q}COO)_tC_qH_{2q}$—
where t is an integer from 1 to 5 and q is an integer from 2 to 4 (such as oxyethylene, oxypropylene, oxybutylene, polyoxyethylene, polyoxypropylene, polyoxybutylene, etc.) and r is the valence of G and can be 2 to 4.

Especially preferred acrylyl compounds are triethylene glycol diacrylate, tetraethylene glycol diacrylate, pentaerythritol triacrylate, trimethylol propane triacrylate and pentaerythritol tetraacrylate.

Typical polymeric binders are: polystyrene, polycarbonate, polyurethane, polyformaldehyde, polyvinyl acetal (including polyvinyl butyral), polyvinyl chloride and copolymers, polyethers (including polyethylene oxide, polypropylene oxide, polytetrahydrofuran), polyacrylates (including polymethyl methacrylate, polyethyl methacrylate, polymethyl acrylate and polyethyl acrylate), polyvinyl esters (including polyvinyl acetate and polyvinyl acetate/acrylate), cellulose esters (including cellulose acetate and cellulose acetate butyrate), cellulose ethers (including methyl cellulose and ethyl cellulose), modified polyolefins (including ethylene/vinyl acetate copolymers), polyvinylidene chloride (including copolymers or vinylidene chloride with acrylonitrile, methyl methacrylate and vinyl acetate), polyamide (including polycaprolactone, polycaprolactam, and polyhexamethylene adipamide) and polyester (including polyethylene glycol terephthalate, and polyhexamethylene succinate).

Photoinitiators used in the photopolymerizable system are preferably those that are activated by actinic light and thermally inactive at 185° C. or below. These include the substituted or unsubstituted polynuclear quinones, such as, 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthaquinone; 9,10-phenanthraquinone; 1,2-benzanthraquinone; 2,3-benzanthraquinone; 2-methyl-1,4-naphthaquinone; 2,3-dichloronaphthaquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthacenequinone; 1,2,3,4-tetrahydrobenz(a)-anthracene-7,12-dione.

The following photoinitiators, described in U.S. Pat. No. 2,760,863, some of which may be thermally active at temperatures as low as 85° C. are also useful: vicinal ketaldonyl compounds, such as, diacetyl and benzil; alpha-ketaldonyl alcohols, such as, benzoin and pivaloin; acyloin ethers, e.g., benzoin methyl and ethyl ethers; α-hydrocarbon substituted aromatic acyloins; α-methylbenzoin; α-allylbenzoin; and α-phenylbenzoin.

Specific benzoin ethers include benzoin methyl ether, benzoin ethyl ether, benzoin phenyl ether, methylbenzoin; and ethylbenzoin.

Certain aromatic ketones, e.g., benzophenone and 4,4'-bis(dialkylamino)benzophenones, are also useful. Specific compounds include benzophenone, 4,4'-bis(dimethylamino)-benzophenone, 4,4'-bis(diethylamino)-benzophenone, 4-hydroxy-4'-diethylaminobenzophenone, 4-hydroxy-4'-dimethylaminobenzophenone, 4-acryloxy-4'-dimethylaminobenzophenone, and 4-methoxy-4'-dimethylaminobenzophenone.

The initiator preferably contains at least one of anacyloin ether, an alkyl-substituted anthraquinone where said alkyl group contains one to four carbon atoms, benzophenone or an alkylaminobenzophenone.

Thermal polymerization inhibitors are also present in the preferred compositions. These include p-methoxyphenol, hydroquinone, and alkyl- and aryl-substituted hydroquinones and quinones, tert-butyl catechol, pyrogallol, copper resinate, naphthylamines, β-naphthol, 2,6-di-tert-butyl p-cresol, 2,2'-methylene-bis(4-ethyl-6-t-butylphenol), pyridine, nitrobenzene, dinitrobenzene, p-toluquinone, chloranil, aryl phosphites, and aryl alkyl phosphites.

The photopolymerizable compositions of this invention, when used as photoresist compositions, will normally be formulated in a suitable solvent, usually an organic solvent, such as a ketone of from three to six carbon atoms, by themselves or in combination with alkanols of from one to three carbon atoms, or the like, wherein the percent solids will generally vary from about 10 to 50 weight percent.

The compositions of this invention can be supplied laminated onto a copper sheet, normally a laminate having a top copper layer in contact with the uncured photoresist composition. A protective film for the photoresist layer may also be provided resulting in a sandwich of the protective film, the uncured photoresist layer and the copper layer. The photoresist layer will generally have a dry thickness of from about 0.25 to 5, usually 0.75 to 4.0 mils thickness. The protective layer will generally be from about 0.5 to 5 mils thickness and may be an inert addition or condensation polymer, such as polyolefins of from 2 to 4 carbon atoms, e.g., polypropylene, polyethylene terephthalate, or the like.

In use, the photopolymerizable dry film is exposed to a source of actinic radiation which may be through a half-tone image or a process transparency; e.g., a process negative or positive, stencil or a mask. Exposure may also be through a continuous tone, negative or positive image. The exposure can be by the contact or projection method, with or without a cover sheet over the photopolymerizable layer or by projection using a cover sheet. These procedures are well known to those skilled in the art. The photoresist compositions are generally used in conjunction with ultraviolet light and the radiation source should furnish an effective amount of this radiation; point or broad radiation sources are effective. Such sources include carbon arcs, mercury-vapor arcs, fluorescent lamps with ultraviolet radiation emitting phosphors, argon glow lamps, electronic flash units and photographic flood lamps. Of these, the mercury vapor arcs, particularly the sun lamps, are most suitable.

The dry film photoresist compositions after exposure can be developed in known manner, for example, by impingement of spray jets, with agitated immersion brushing or scrubbing to desirable images with an organic solvent or mixture thereof capable of washing away the unexposed portions of the resist film. Useful solvents include cellosolve acetate, ethyl acetate, methyl ethyl ketone, acetone, tetrachloroethylene, the alkanols of one to four carbon atoms, butyl cellosolve, chlorobenzene and dimethylformamide or water or mildly alkaline solution, which may contain small amounts of organic additives.

Besides use in photoresist compositions, the subject photopolymerizable compositions can also find application in ultraviolet, curable coding and printing compositions. These compositions will for the most part have a free radical addition polymerizable monomer, a photoinitiator, and the print-out dye composition of this invention, in addition to other specialized additives, which have been previously described. These compositions will generally have from about 0.1 to 6, more usually from about 0.2 to 5 weight percent of the subject print-out dye composition.

While the ethylenically unsaturated compounds previously described are useful, the acrylyl compounds are particularly useful, especially in the form of acrylyl oligomers and esters, as described above.

One useful class of oligomers is obtained by reacting an organic polyether or polyester polyol with a diisocyanate to provide an isocyanate-terminated prepolymer. This product can be reacted with an unsaturated alcohol, such as a hydroxyalkyl acrylate to provide, either alone or in combination with other unsaturated monomers, a material that will polymerize under the influence of free radicals to form a hard, tough, adherent film.

In a variation of the foregoing, a polymercaptoester such as trimethylolpropane tris(thioglycolate); trimethylolpropane tris(mercaptopropionate); pentaerythritol tetrakis(thioglycolate); pentaerythritol tetrakis(mercaptopropionate); and the like are reacted with a diisocyanate to provide a polythiourethane intermediate which can be reacted with an unsaturated alcohol, such as a hydroxyacrylate to provide, either alone or in combination with other unsaturated monomers, a free radical polymerizable material having excellent film properties after crosslinking.

Another illustration of a useful oligomer is an acrylatecapped polycaprolactone polyurethane, obtained by reacting a hydroxy-terminated polycaprolactone with a diisocyanate and thereafter reacting the isocyanate-terminated intermediate with an unsaturated alcohol such as a hydroxyalkyl acrylate.

Still another useful class of oligomers is obtained by reacting an epoxy resin with acrylic acid to obtain an epoxy diacrylate. For example, an epichlorohydrin/bisphenol A type epoxy resin can be reacted with a stoichiometric amount of acrylic acid. Such products are available commercially as under the trademark "Epocryl" from Shell Chemical Company. Alternatively, one could use Ucar-80 from Union Carbide Company. Such materials can be combined with a variety of acrylic esters including neopentyl glycol diacrylate, hydroxyethyl acrylate and dicyclopentenyl acrylate and other unsaturated esters of polyols including such esters of methylene carboxylic acid such as ethylene diacrylate; diethylene glycol diacrylate; glycerol diacrylate; glycerol triacrylate; ethylene dimethacrylate; 1,3-propylene dimethacrylate; 1,2,4-butanetriol trimethacrylate, 1,4-benzenediol dimethacrylate; pentaerythritol tetramethacrylate; 1,3-propanediol diacrylate; 1,6-hexanediol diacrylate; the bis-acrylates and methacrylates of polyethylene glycols of molecular weight 200–500; trimethylolpropane triacrylate; pentaerythritol triacrylate; and other ethylenically unsaturated compounds, to polymerize under the influence of free-radicals to form films of excellent adhesion and toughness.

Another composition comprises a combination of a terminally unsaturated urethane composition (polyene) and a polythiol which are polymerizable under the influence of free-radicals generated by the action of actinic light on a photoinitiator.

The coating and printing ink compositions will contain a predominant amount of film forming materials and photosensitizer and a relatively minor amount of leuco dye and halogen compound. For example, a typical composition will contain from 15 to 70% by weight of an ethylenically unsaturated compound as described above, 10–50% of one or more unsaturated monomers or of a preferred polymeric binder, 0.1 to 15% by weight of a photoinitiator; 0.01 to 3% by weight of leuco dye as described above and 0.1 to about 5% of halogen containing compound. A more narrow range is from about 40 to about 55% of ethylenically unsaturated compound, from 30–45% of monomer or of polymeric binder, from 0.5 to 15% of total initiator, from 0.5 to 2% of dye base and from 0.8 to 4% of halogen compound (all % by weight).

The photoresist compositions are frequently provided as a laminated sandwich, with the photoresist layer between two strippable polymeric films. One of the films should be substantially transparent to actinic light. The films will normally be from about 0.25 to 10 mils thickness.

The following examples are offered by way of illustration and not by way of limitation.

EXAMPLE 1

The following photopolymerizable composition was prepared:

| | | |
|---|---|---|
| Acrylic polymer (56% ethyl acrylate, 37% methyl methacrylate and 7% acrylic acid, with an inherent viscosity of 0.458 in methyl ethyl ketone at 30° C.) | 12.63 | gram |
| Styrene-maleic anhydride copolymer, partially esterified with acid number of 270 and a molecular weight of 1700. | 12.63 | gram |
| Triethylene glycol dimethacrylate | 6.67 | gram |
| Benzophenone | 1.30 | gram |
| 4,4'-bis(dimethylamino)benzophenone | 0.067 | gram |
| Brilliant Green dye (C.I. 42040) | 0.0027 | gram |
| Leuco Crystal Violet | 0.39 | gram |
| 1,2,3,4,5-pentabromo-6-chlorocylohexane | 0.63 | gram |
| Methyl ethyl ketone | 100.00 | gram |

The solution contained about 25% solids, and was coated with a "doctor knife" on 0.00092 inch thick, biaxially oriented and heat set polyethylene terephthalate film. The coating was air dried, resulting in a very light green film with a dry thickness of 0.00130 inch. A piece of copper clad epoxy-fiberglass board is scrubbed and dried using a Somaca Model SBC-12G scrubber. The copper board is laminated with the dried photopolymerizable composition using a Xidex laminator at 115° C., at a rate of 3–4 feet per minute. The resulting composite of polyester film, photopolymerizable composition, the copper has a slight green color with sufficient contrast under yellow light to discern any bare copper. The copper sandwich is exposed for 10 seconds, to a transparency, using a Colight 1200 watt DMVL-A ultraviolet exposure source. Immediately after exposure, a strong purple image is formed in the exposed areas which have excellent contrast with the light green background. The board is developed in a DEA Americana 2401 developer with a 30" spray chamber. The totally aqueous developer contains 0.75% by weight sodium carbonate monohydrate at 80°-85° F. Using a spray pressure of 20 pounds per square inch and a throughput rate of 3.5 feet per minute, the board is passed through the developer. After rinsing and drying, the remaining exposed image has a strong color which has remained virtually unchanged since exposure. The board is dipped for 1 minute in 20% ammonium persulfate solution, rinsed with large amounts of water, dipped in a 20% solution of HCl for 1 minute, again rinsed with water and then plated for 45 minutes in an acid copper sulfate bath at 25 amperes per square foot, at ambient temperature. After plating, no discernible color change of the resist image had taken place. The board was again rinsed, dipped for 1 minute in 15% fluoboric acid and then plated for 30 minutes in a Pb/Sn plating bath using 15 amperes per square foot at ambient temperatures. As before, no discernible change in color was observed. The purple resist image was stripped by dipping in 3.0% by weight KOH solution at 40° C. for 40 seconds. After rinsing, the board was etched in $FeCl_3$ solution which removed any unprotected copper to give a usable electronic circuit board.

EXAMPLE 2

The composition of Example 1 was used, except that the print-out dye employed was an equal amount of leuco Malachite Green and the other dye, an equal amount of Pararosaniline Acetate (C.I. 42500). After coating, the composition had a slight red color which gave good contrast under yellow light with the dark green print-out image that resulted after exposure. The board was again developed under the same conditions, but the exposed copper was then etched away in a DEA etcher containing Ac-Cu Guard etching solution at a pH of 8.7 and a temperature of 45° C. The board passed through the six foot etching chambers at the rate of 6 feet per minute. Although the resist had dulled slightly, the color was virtually unchanged.

EXAMPLE 3

The following photopolymerizable composition was prepared:

| | |
|---|---|
| Poly(methylmethylmethacrylate) inh. vis. in methyl ethyl ketone at 30° C. = 0.380 | 9.36 gram |
| Trimethylolpropane triacrylate | 2.50 gram |
| Tetraethylene glycol dimethacrylate | 2.50 gram |
| Dioctylphthalate | 0.10 gram |
| Benzophenone | 0.85 gram |
| 4,4'-bis(dimethylamino)benzophenone | 0.030 gram |
| 4-methyl-2,6-di-t-butylphenol | 0.002 gram |
| Brilliant Green Dye (C.I. 42040) | 0.002 gram |
| 2-mercaptobenzothiazole | 0.010 gram |
| 1,2,3,4,5-pentabromo-6-chlorocyclohexane | 0.255 gram |
| Leuco Pararosaniline | 0.175 gram |
| Methyl ethyl ketone | 33.0 gram |

The solution was coated to a dry thickness of 1.5 mil on 0.00092 inch thick polyester film. It was then laminated as in Example 1 to clean copper-clad laminate. The film was exposed for 15 seconds in the DMVL-A which resulted in a strong red print-out on a green background. The exposed board was held at room conditions for 15 minutes and then developed in 1,1,1-trichloroethane at 7 feet/minute, at 68° F. After drying the board was pre-plate cleaned as in Example 1. It was then plated at 125° F. in a copper-pyrophosphate plating bath for 45 minutes using 25 amperes per square foot. After plating, the board was inspected for loss in color: no loss was observed. A second formulation not using 2-mercaptobenzothiazole gave similar results, except that the adhesion of the resist after plating was poor.

EXAMPLE 4

The following photopolymerizable composition was prepared:

| | |
|---|---|
| Acrylic polymer with an inherent viscosity of 0.11 in methyl ethyl ketone at 30° C. Acid number of 55–60. | 21.00 gram |
| Trimethylolpropane triacrylate | 3.30 gram |
| Triethylene glycol dimethacrylate | 3.30 gram |
| Benzophenone | 1.75 gram |
| 4,4'-bis(dimethylamino)benzophenone | 0.092 gram |
| 4-methyl-2,6-di-t-butylphenol | 0.0014 gram |
| Basic Blue 26 (C.I. 44045) | 0.0040 gram |
| Brilliant Green | 0.0008 gram |
| Leuco Crystal Violet | 0.300 gram |
| 1,2,3,4,5-pentabromo-6-chlorocyclohexane | 0.50 gram |
| Methyl ethyl ketone | 50.00 gram |
| Methanol | 2.00 gram |

The solution was coated as previously to a dry thickness of 0.00150 inch on 0.00092 inch thick polyester base. After drying, three pieces were laminated to three 5"×6" 1 oz. copper-clad epoxy-fiberglass boards. A fourth piece was laminated with 0.0010 inch thick polyethylene. This piece of film was taped to the wall for later use. One copper board was placed in a Blue M Oven for three days at 35°–38° C. A second board was placed in a drawer at ambient temperatures, while the third board was exposed and developed as in Example 1. A dark purple print-out image resulted with a photospeed of 9 $\sqrt{2}$ steps on a standard stepwedge tablet. A similar composition was prepared, except that the halogenated cyclohexane was replaced by 0.32 g. carbon tetrabromide. After exposure and development a similar purple image was obtained showing 10 $\sqrt{2}$ steps. After three days in the oven or three weeks at room temperature (both on the copper and in polyethylene laminated sample) there was no change in photospeed or print-out image density using the brominated cyclohexane derivative. Nor had the film color darkened as measured by a Perkin Elmer 402 Ultraviolet spectrophotometer. In the formulation where carbon tetrabromide was substituted for the halogenated cyclohexane, the following occurred: the sample in the oven had turned completely purple, and no print-out image was formed upon exposure. The photospeed had dropped by 2 $\sqrt{2}$ steps. The sample on copper which had been stored in the drawer gave a slight print-out image over the darker background, with a similar loss in photospeed. The sample laminated with polyethylene had increased by a factor of 2.5 in background density and had lost 1 $\sqrt{2}$ steps. Similar results were obtained when 2',3',4'-trichloroacetophenone, N-chlorosuccinimide or iodoform were used.

EXAMPLE 5

A coating composition was prepared from the following ingredients:

| | |
|---|---|
| Actomer X-80 (epoxidized soya bean oil from Union Carbide) | 30.00 gram |
| Trimethylolpropane triacrylate | 20.00 gram |
| Pentaerythritol triacrylate | 10.00 gram |
| Vinyl Acetate | 20.00 gram |
| Benzophenone | 12.00 gram |
| 4,4'-bis(dimethylamino)benzophenone | 1.0 gram |
| 1,2,3,4,5-pentabromo-6-chlorocyclohexane | 1.5 gram |
| Leuco Crystal Violet | 1.0 gram |

The solution was coated on a piece of cardboard with a 10 mil "doctor knife". The tacky coating was then exposed to a high intensity ultraviolet light source for 60 seconds (DMVL-A, 1200 Watt bulb). A deeply colored tough scratch resistant film was obtained which could not be attacked with methanol or 1,1,1-trichloroethane.

As evidenced by the above results, use of the print-out dye compositions of the subject invention provide for excellent results in the production of photopolymerizable compositions. The dyes do not interfere with the photocuring of the polymers, so that a stable coating is obtained. Furthermore, the compositions can be stored for long periods of time either as formulations or uncured films, without affecting the properties of the compositions. In addition, the print-out dye compositions do not produce noisome or dangerous fumes during processing, nor is there any evidence of lachrymatory effects. Finally, the desired color is retained to provide the necessary contrast during subsequent processing.

What we claim and desire to protect by Letters Patent is:

1. A contrast colorant for photopolymerizable compositions comprising in combination a leuco triarylmethane dye in combination with a sufficient amount for formation of the colored form of said dye upon irradiation with actinic light of a bromine-substituted cyclohexane wherein said substituents comprise at least five bromine atoms and from 0 to 1 chlorine atoms.

2. A composition according to claim 1, wherein the mole ratio of said dye to said bromine-substituted cycloalkane is 0.2-5.

3. A composition according to claims 1 or 2, wherein said triarylmethane leuco dye has at least one amino substituent.

4. A colorant composition for use in photopolymerizable compositions comprising in combination a triarylmethane leuco dye of the formula:

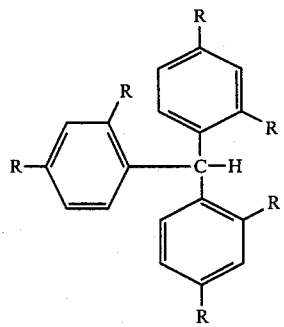

wherein the R groups can be the same or different and are hydrogen, amino, oxy, hydroxy, alkoxy of 1-2 carbon atoms, alkyl of 1-2 carbon atoms, or halo; and a bromocyclohexane of the formula

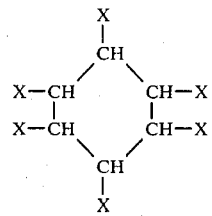

wherein the X substituents can be the same or different and are hydrogen, bromine, or chlorine; with at least five of the X's being bromine; wherein the mole ratio of dye to bromocyclohexane is in the range of from about 0.5 to about 2.0.

5. A photopolymerizable composition comprising:
   (1) an addition polymerizable photoinitiator;
   (2) a polymeric binder;
   (3) a polymerizable monomer capable of photopolymerization initiated by said photoinitiator; and
   (4) a contrast colorant composition comprising in combination a leuco triarylmethane dye in combination with a sufficient amount for formation of the colored form of said dye upon irradiation with actinic light of a bromine-substituted cyclohexane, wherein said substituents are other than geminally substituted and comprise at least five bromine atoms and from 0 to 1 chlorine atoms.

6. The composition of claim 5 wherein said polymerizable monomer is an acrylate.

7. The composition of claim 5 wherein said polymeric binder is an acrylic polymer.

8. In a photopolymerizable composition comprising:
   (1) a photoinitiator;
   (2) a polymeric binder;
   (3) a photopolymerizable monomer; and
   (4) a contrast colorant; the improvement of using as contrast colorant a system comprising in combination a leuco triarylmethane dye in combination with a bromine-substituted cyclohexane, wherein said substituents are other than geminally substituted and comprise at least five bromine atoms and from 0 to 1 chlorine atoms, said dye and bromine-substituted cyclohexane being present in a mole ratio of dye to substituted cyclohexane of from about 0.5 to about 2.0.

9. A photopolymerizable composition comprising from about 40 to 70 weight percent of a polymeric binder; from about 0.01 to 10 weight percent of a photoinitiator; from about 30 to 50 weight percent of an addition polymerizable monomer capable of photoinitiated polymerization by said photoinitiator, and a contrast colorant according to claims 1 to 6 wherein said leuco dye is present in from 0.01 to 2 weight percent of the total composition and said bromine-substituted cyclohexane is present in from 0.1 to 4 weight percent of the total composition.

10. A composition according to claim 9, wherein said composition is a solution in an organic solvent having from about 10 to 50 weight percent solids.

11. A composition according to claim 9, wherein said composition is coated to a thickness of about 0.25 to about 5 mils on a copper sheet.

* * * * *

UNITED STATES PATENT AND TRADEMARK OFFICE
CERTIFICATE OF CORRECTION

PATENT NO. : 4,297,435
DATED : October 27, 1981
INVENTOR(S) : J. L. Jolly & L. Roos It is certified that error appears in the above-identified patent and that said Letters Patent are hereby corrected as shown below:

Col. 14, line 57 " claims 1 to 6 " should read -- claims 1 to 4 --.

Signed and Sealed this

Twenty-sixth Day of January 1982

[SEAL]

Attest:

GERALD J. MOSSINGHOFF

Attesting Officer  Commissioner of Patents and Trademarks